United States Patent [19]

Mizumura et al.

[11] Patent Number: 4,539,530
[45] Date of Patent: Sep. 3, 1985

[54] TRANSISTORIZED MICROWAVE OSCILLATOR OF OSCILLATION FREQUENCY MULTIPLYING TYPE

[75] Inventors: Motoo Mizumura; Kenzo Wada, both of Tokyo, Japan

[73] Assignee: Nippon Electric Co., Ltd., Tokyo, Japan

[21] Appl. No.: 479,541

[22] Filed: Mar. 28, 1983

[30] Foreign Application Priority Data

Mar. 29, 1982 [JP] Japan ................................. 57-50789

[51] Int. Cl.³ ............................................. H03B 5/00
[52] U.S. Cl. ............................... 331/117 FE; 331/76; 331/107 DP
[58] Field of Search ............ 331/117 D, 117 FE, 76, 331/77, 96, 107 DP; 333/34, 208, 212, 228

[56] References Cited

U.S. PATENT DOCUMENTS 3,045,188 7/1962 Howell et al. ................... 331/76 X
4,201,956 5/1980 Kienberger et al. .... 331/107 DP X

OTHER PUBLICATIONS

John J. Thomas, "Frequency Modulated Gunn Oscillator", RCA Technical Notes, Jan. 1967.

Primary Examiner—Eugene R. Laroche
Assistant Examiner—Robert J. Pascal
Attorney, Agent, or Firm—Sughrue, Mion, Zinn, Macpeak, and Seas

[57] ABSTRACT

A transistorized microwave oscillator comprising a resonator 2 coupled to a transistor 4, 5 and a feedback capacitor 7' around the transistor which produces a fundamental oscillation frequency and harmonics thereof. The feedback capacitor is located within a cut-off waveguide 21 and couples oscillations into the waveguide which blocks the lower undesired frequencies.

18 Claims, 6 Drawing Figures

4,539,530

TRANSISTORIZED MICROWAVE OSCILLATOR OF OSCILLATION FREQUENCY MULTIPLYING TYPE

BACKGROUND OF THE INVENTION

The present invention relates to a microwave oscillator, and more particularly to a transistorized microwave oscillator of the oscillation frequency multiplying type.

A typical transistorized microwave oscillator of the prior art is composed of a fundamental wave oscillator circuit involving a resonator and a frequency multiplier circuit for generating a required harmonic by multiplying the fundamental frequency of this oscillator circuit. Such an oscillator uses a frequency multiplier having a varactor diode for generating the required harmonic, requires a holding mechanism, a biasing circuit and the like for the diode, and accordingly has the disadvantages of complex structure and higher cost. Moreover, since the oscillator circuit and the multiplier are directly connected to each other, the load impedance of the former is the input impedance of the latter. Because of the consequent absence of buffering between them with respect to impedance fluctuations, any impedance fluctuation of the multiplier would become a load fluctuation of the oscillator circuit, resulting in the disadvantages that the start of oscillation is unreliable, and sometimes the oscillation even fails to start at all, furthermore frequency and output level fluctuations due to temperature variations are unstable, and abnormal oscillation is more likely to occur.

SUMMARY OF THE INVENTION

Therefore, an object of the present invention is to provide a microwave transistor oscillator which has a simple structure and, moreover, whose electrical characteristics are stable.

According to the invention, there is provided a transistorized microwave oscillator comprising: oscillating means, including at least a transistor for oscillation and feedback oscillating, for generating a fundamental oscillating frequency and its harmonic components; and a cutoff waveguide connected to said oscillating means for cutting off said fundamental frequency and undesired lower-order harmonics to thereby provide a desired higher-order harmonic, wherein a part of said feedback comprises means for coupling said oscillating means to said cutoff waveguide.

BRIEF DESCRIPTION OF DRAWINGS

Other objects and features of the present invention will be more apparent from the detailed description hereunder taken in conjunction with the accompanying drawings, wherein.

DETAILED DESCRIPTION OF THE INVENTION

Figure 1:
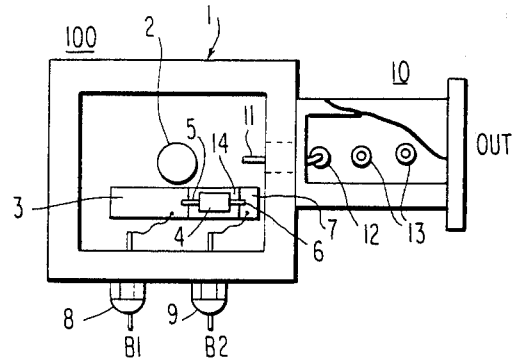
FIG. 1 shows a partial sectional plan view of a typical structure of the conventional transistorized microwave oscillator.
Figure 2:
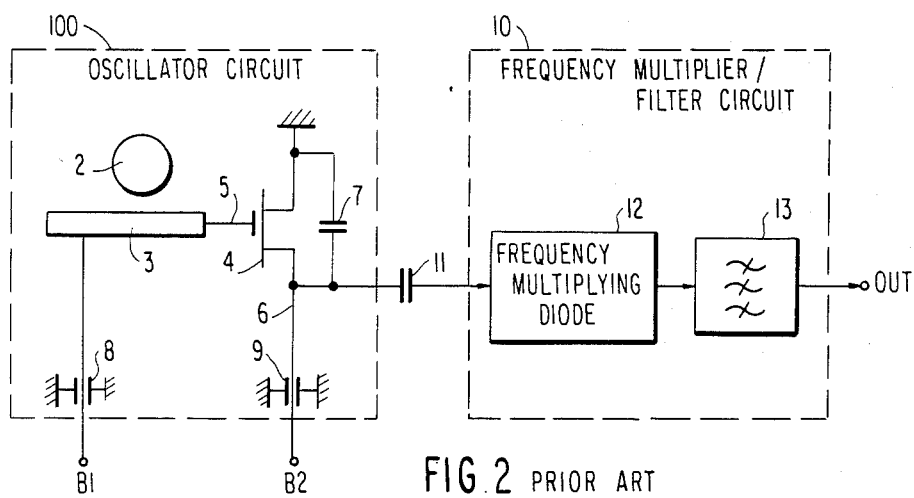
FIG. 2 shows a circuit diagram of the oscillator structure shown in FIG. 1.

FIG. 1 illustrates the structure of such a conventional transistorized microwave oscillator. FIG. 2 shows an example circuit of the oscillator structure shown in FIG. 1. In FIGS. 1 and 2, the transistorized microwave oscillator comprises an oscillator circuit 100 and a frequency multiplier/filter circuit 10.

The oscillator circuit 100 built in a metal chassis 1 comprises an oscillator transistor 4 (for example, a GaAs FET), a high Q resonator 2 (for example, a dielectric resonator), a microstrip line 3 and a feedback capacitor 7. The microstrip line 3 comprises a substrate made of a ceramic, and metal patterns formed thereon, as will be apparent from FIG. 3B. The line 3 couples the resonator 2 to the gate 5 of the transistor 4. The capacitor 7, which comprises a dielectric substrate and metal patterns formed thereon, is connected between the drain and the source of the transistor 4. DC bias voltages are supplied to terminals B1 and B2 and then to the gate and source of the transistor 4 through feedthrough capacitors 8 and 9, which block high frequencies. The drain of the transistor 4 is grounded. The output of the oscillator circuit 100 is coupled to the frequency multiplier/filter circuit 10 through a coupling antenna 11.

The frequency multiplier/filter circuit 10 comprises a frequency multiplying diode 12 and a waveguide filter including resonating rods 13. The diode 12 multiplies the fundamental oscillation frequency of the oscillator circuit to provide harmonics thereof. The waveguide filter filters the harmonics to supply a desired Nth (N=2, for example) harmonic to a terminal OUT.

Figure 3A:
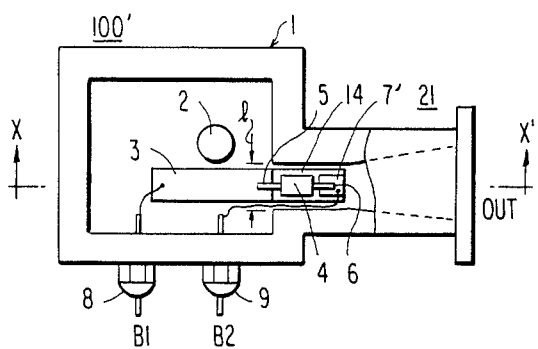
FIG. 3A shows a partial sectional plan view of an embodiment of the microwave oscillator according to the invention.
Figure 3B:
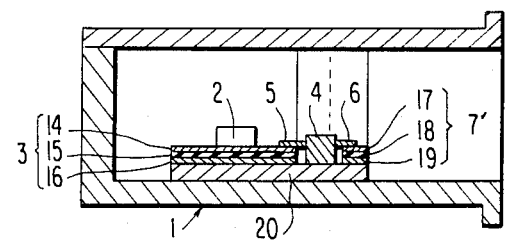
FIG. 3B shows a cross section along the section line X-X' of the embodiment illustrated in FIG. 3A.

The microstrip line 3 and feedback capacitor 7 are mounted on a metal subcarrier, as will be obvious from FIG. 3B, which is soldered to the metal chassis 1.

The transistor 4 may be a silicon bipolar transistor. Also, the resonator 2 may comprise a metal cavity resonator.

With the conventional structure, the frequency multiplying diode is used for extracting the needed Nth harmonic. Also, the use of the diode necessitates a mechanism to hold the diode, a biasing circuit and the like. As a result, the structure has the disadvantages of complexity and a higher cost. It further has the following electrical disadvantage that the oscillator circuit 100 and the diode 12 are directly connected electromagnetically to each other, the load impedance of the former is the input impedance of the latter. In other words, because of the consequent absence of bufferings effect between them with respect to impedance fluctuation, any impedance fluctuation of the diode 12 would become a load fluctuation of the oscillator circuit 100, resulting in unreliable starting of oscillation, which may sometimes even fail to start at all. Moreover, it leads to the instability of frequency and output level fluctuations due to temperature variation, and an abnormal oscillation.

Figure 4:
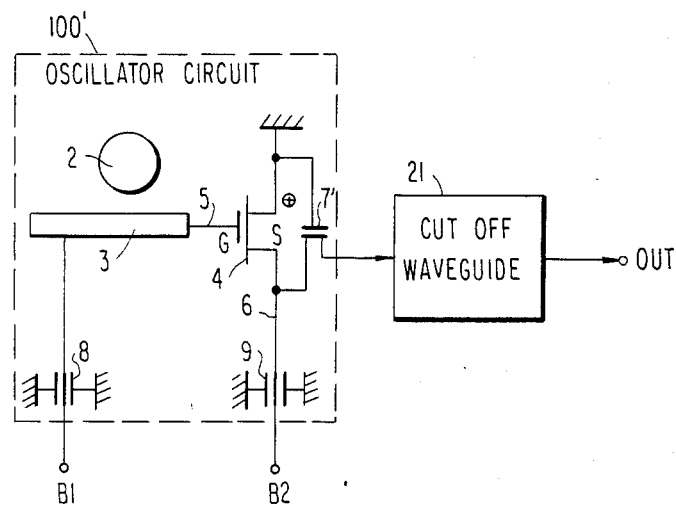
FIG. 4 is a circuit diagram corresponding to the oscillator structure shown in FIG. 3A.

FIGS. 3A and 3B illustrate the structure of one preferred embodiment of the invention, which is free of these disadvantages. FIG. 4 shows an example of circuitry corresponding to the microwave oscillator structure shown in FIGS. 3A and 3B. In FIGS. 3A, 3B and 4, the transistorized microwave oscillator comprises an oscillator circuit 100' and a cutoff waveguide 21. Constituent elements performing respectively the same functions as the corresponding ones in FIG. 1 are assigned the same reference numerals.

The oscillator of the present invention is featured by including the cutoff waveguide 21. The waveguide 21 has an input section which is squeezed in shape to cut off the fundamental oscillation frequency and unneeded lower-order harmonics and thereby provide a needed higher-order harmonic. A length l shown in FIG. 3A constitutes a cutoff size against the fundamental oscillation frequency and unneeded lower-order harmonics.

Another feature of the present oscillator is that coupling of the required Nth harmonic between the oscillator circuit 100′ and the waveguide 21 is achieved by the use of a metal pattern 17 of the feedback capacitor 7′, which is provided within the waveguide 21. The feedback capacitor 7′ being located within the waveguide 21 also acts as an antenna for coupling the oscillator circuit 100′ to the waveguide 21.

The feedback capacitor 7′ comprises a substrate 18 and metal patterns 17 and 19 formed thereon. The metal pattern 19 is grounded to a metal subcarrier 20. The microstrip line 3 comprises a dielectric substrate 15 and metal patterns 14 and 16. The pattern 14 is connected to the gate of the transistor 4. The metal pattern 16 is grounded to the subcarrier 20, which is soldered to the chassis 1.

In the oscillator illustrated in FIGS. 3A and 3B, the output circuit consists of the cutoff waveguide 21, which electromagnetically separates the oscillator circuit 100′ from other circuits. Since this oscillator enables the output circuit to be coupled to the Nth harmonic component of the oscillator circuit 100′, between whose fundamental oscillation wave level and the Nth harmonic level is a conversion loss of L dB (L>0), there is in effect an attenuator of L dB between the oscillator circuit 100′ and other circuits. That is, the output circuit is in effect provided with an attenuator, resulting in a substantial improvement of the effect of impedance variation in the output circuit of the oscillator circuit 100′.

Figure 5:
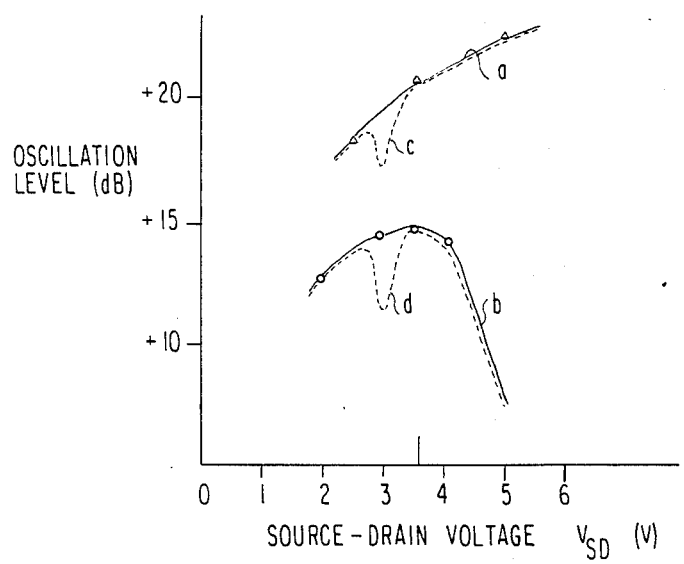
FIG. 5 is a diagram comparing the source drain voltage ($V_{SD}$) vs. oscillation level characteristic of the oscillator according to the invention with that of the conventional oscillator.

FIG. 5 shows the comparison of the source drain voltage $V_{SD}$ vs. oscillation level characteristic of the present oscillator of FIG. 3A and 3B and that of the conventional oscillator of FIG. 1. In FIG. 5, solid lines a and b illustrate the characteristics of the oscillator of FIGS. 3A and 3B, and broken lines c and d, illustrate examples of abnormal oscillation to which the conventional oscillator of FIG. 1 is susceptible. The solid line a and the broken line c refer to characteristics at the fundamental oscillation frequency of 10 GHz, and the solid line b and the broken line d, to characteristics at the 2nd harmonic frequency of 20 GHz. Since, as is evident from FIG. 5, there is a level difference (i.e. a conversion loss) of 4 to 6 dB between the fundamental oscillation wave level and the 2nd harmonic level at the source-drain voltage $V_{SD}$ of about 3.5 V, the present invention provides bufferings equivalent to a return loss of 8 to 12 dB. This buffer effect enables the start of oscillation to be reliably achieved, stabilizes the frequency and output level fluctuations due to temperature variation, and fully prevents, as the solid lines a and b show, the abnormal oscillation represented by the broken lines c and d. While these instances of abnormal oscillation are shown at the voltage $V_{SD}$ of about 3 V in the diagram, they are mere examples.

As described above, according to the present invention, the feedback capacitor constituting a part of the oscillator circuit is utilized as the coupling circuit for extracting the needed harmonic from the oscillator circuit. Also, the feedback capacitor is concurrently used as an antenna. The Nth harmonic component of the fundamental oscillation wave radiated from the antenna is extracted into another circuit through the cutoff waveguide. Since the waveguide and the oscillator circuit are connected to each other by a mere waveguide having the width of cutoff size, there are needed no complexly structured coupling antenna of a frequency multiplier circuit of the conventional oscillator. Also, the oscillator circuit can be readily incorporated with the waveguide by a solid piece of metal. Therefore, the invention contributes to cost reduction through the simplified structure and the manufacturing ease it makes possible.

What is claimed is:

1. A transistorized microwave oscillator comprising: oscillating means, including a transistor for oscillation and feedback means, for generating a fundamental oscillating frequency and harmonic components thereof; and a cutoff waveguide connected to said oscillating means for cutting off at least said fundamental oscillating frequency to provide a needed harmonic, wherein a part of said feedback means comprises means for coupling said oscillating means to said cutoff waveguide.

2. A transistorized microwave oscillator, as claimed in claim 1, wherein said feedback means is a capacitor comprising a dielectric substrate and metal patterns formed thereon.

3. A transistorized microwave oscillator, as claimed in claim 1, wherein said transistor comprises a GaAs FET.

4. A transistorized microwave oscillator, as claimed in claim 1, wherein said feedback means is provided within said cutoff waveguide.

5. A transistorized microwave oscillator, as claimed in claim 1, wherein said transistor comprises a silicon bipolar transistor.

6. A transistorized microwave oscillator, as claimed in claim 1, wherein said oscillating means further comprises a resonator and a line for coupling said transistor to said resonator.

7. A transistorized microwave oscillator, as claimed in claim 6, wherein said line is a microstrip line comprising a dielectric substrate and metal patterns formed thereon.

8. A transistorized microwave oscillator, as claimed in claim 6, wherein said resonator comprises a dielectric resonator.

9. A transistorized microwave oscillator, as claimed in claim 7, further comprising a metal subcarrier for mounting thereon said line and said transistor.

10. A transistorized microwave oscillator, as claimed in claim 2, further comprising a metal subcarrier for mounting thereon said transistor and said capacitor.

11. A transistorized microwave oscillator comprising: oscillating means, including a transistor for oscillation and feedback means, for generating a fundamental oscillationg frequency and harmonic components thereof; and cutoff waveguide connected to said oscillating means for cutting off at least said fundamental oscillating frequency to provide a needed harmonic, wherein said feedback means is provided within said cutoff waveguide and a part of said feedback means couples said oscillating to said cutoff waveguide.

12. A transistorized microwave oscillator as claimed in claim 11, wherein said feedback means is a capacitor comprising a dielectric substrate and metal patterns formed thereon.

13. A transistorized microwave oscillator as claimed in claim 11, wherein said transistor comprises a GaAs FET.

14. A transistorized microwave oscillator as claimed in claim 11, wherein said oscillating means further comprises a resonator and a line for coupling said transistor to said resonator.

15. A transistorized microwave oscillator as claimed in claim 14, wherein said line is a microstrip line comprising a dielectric substrate and metal patterns formed thereon.

16. A transistorized microwave oscillator as claimed in claim 14, wherein said resonator comprises a dielectric resonator.

17. A transistorized microwave oscillator as claimed in claim 15, futher comprising a metal subcarrier for mounting thereon said line and said transistor.

18. A transistorized microwave oscillator as claimed in claim 12, further comprising a metal subcarrier for mounting thereon said transistor and said capacitor.

* * * * *

UNITED STATES PATENT AND TRADEMARK OFFICE
CERTIFICATE OF CORRECTION

PATENT NO. : 4,539,530

DATED : September 3, 1985

INVENTOR(S) : Motoo Mizumura, et al.

It is certified that error appears in the above-identified patent and that said Letters Patent is hereby corrected as shown below:

Column 1, line 41, after "feedback" delete "oscillating";
          line 41, after "fundamental" delete "oscillating".
Column 4, line 60, "lationg" should be --lating--;
          line 66, after "oscillating" insert --means--.

Signed and Sealed this

Eighth Day of April 1986

[SEAL]

Attest:

DONALD J. QUIGG

Attesting Officer

Commissioner of Patents and Trademarks